(12) United States Patent
Shaffer (10) Patent No.: US 7,466,002 B2
(45) Date of Patent: Dec. 16, 2008

(54) INCIDENT LIGHT ANGLE DETECTOR FOR LIGHT SENSITIVE INTEGRATED CIRCUIT

(75) Inventor: Jamie Lyn Shaffer, Bothell, WA (US)

(73) Assignee: Mitutoyo Corporation, Kawasaki-shi (JP)

( * ) Notice: Subject to any disclaimer, the term of this patent is extended or adjusted under 35 U.S.C. 154(b) by 125 days.

(21) Appl. No.: 11/471,054

(22) Filed: Jun. 19, 2006

(65) Prior Publication Data
US 2007/0290284 A1    Dec. 20, 2007

(51) Int. Cl.
*C23C 16/52* (2006.01)
*C23C 14/22* (2006.01)
*C23C 16/44* (2006.01)
*H01L 31/062* (2006.01)
*H01L 21/66* (2006.01)

(52) U.S. Cl. ............ 257/432; 257/248.1; 257/E31.122; 438/758; 438/778; 438/144.8

(58) Field of Classification Search ........... 257/E31.122
See application file for complete search history.

(56) References Cited

U.S. PATENT DOCUMENTS

| | | | |
|---|---|---|---|
| 4,857,721 A | 8/1989 | Dunavan et al. | |
| 5,264,910 A | 11/1993 | Hill | |
| 5,995,229 A | 11/1999 | Omi | |
| 6,274,862 B1 | 8/2001 | Rieger | |
| 6,316,814 B1 * | 11/2001 | Nagata et al. | ............ 257/435 |
| 6,642,506 B1 | 11/2003 | Nahum et al. | |
| 6,875,974 B2 * | 4/2005 | Muesch et al. | ........... 250/203.1 |
| 7,214,920 B2 * | 5/2007 | Gazeley | .............. 250/208.1 |
| 2001/0026322 A1 * | 10/2001 | Takahashi et al. | ........... 348/340 |
| 2002/0053635 A1 | 5/2002 | Schroter et al. | |
| 2004/0159774 A1 * | 8/2004 | Mishina et al. | ........... 250/208.1 |
| 2004/0173737 A1 | 9/2004 | Shimomura et al. | |
| 2005/0017158 A1 | 1/2005 | Kojima | |

FOREIGN PATENT DOCUMENTS

EP    0 747 719 A1    12/1996

OTHER PUBLICATIONS

U.S. Appl. No. 11/396,368, filed Mar. 31, 2006, Sesko.

* cited by examiner

*Primary Examiner*—Evan Pert
*Assistant Examiner*—Ben P Sandvik
(74) *Attorney, Agent, or Firm*—Christensen O'Connor Johnson Kindness PLLC (57) ABSTRACT

A detector configuration determines the direction of illumination incident on a photosensitive device. Multiple mask layers include holes which form an interlayer optical path through which radiation reaches a photodetector. The interlayer optical path provides a selected nominal maximum signal angle and the detector senses when radiation is received at or near that angle. In one embodiment, three holes in three metallization layers provide an arbitrarily narrow interlayer optical path with improved angular detection relative to that provided by two holes. An illumination direction-sensing array may use multiple instances of the detector configuration. The detector configuration may provide enhanced utility and economy by being adapted to use only those fabrication steps used for fabricating other primary circuits on an IC.

23 Claims, 4 Drawing Sheets

INCIDENT LIGHT ANGLE DETECTOR FOR LIGHT SENSITIVE INTEGRATED CIRCUIT

FIELD OF THE INVENTION

The invention relates generally to a detector configuration for determining an angle of incidence of light on a photodetector, and in one example embodiment, the detector configuration may be utilized to indicate the degree of photodetector and/or light source misalignment in position encoders or the like.

BACKGROUND OF THE INVENTION

Various angle of incidence detectors are known, such as those disclosed in U.S. Pat. No. 4,857,721 to Dunavan, et al., European Patent Specification EP 0747719 to Cantin, et al., and U.S. Patent Application Publication No. 2002/0053635 to Schroter, et al., each of which is incorporated herein by reference. However, each of the preceding references teaches that at least one "shadow mask" critical to the operation of the disclosed devices is formed separately from the photodetector elements of the disclosed devices. For at least this reason, at least one aspect of a combination of features including fabrication cost, size, and/or the measurement resolution of the disclosed detector configurations is undesirable for many applications.

U.S. Pat. No. 6,875,974 to Muesch and Budde (the '974 patent), which is hereby incorporated herein by reference, discloses an apparatus wherein each respective radiation-transmitting area of a shading mask is arranged with a respective degree of overlap or displacement relative to a respective pair of photodiodes. The various respective degrees of overlap cause the null signal from each respective pair of photodiodes to correspond to a respective angle of incidence. The photodiodes of each pair are connected to one another. Each photodiode comprises p- and n-regions arranged symmetrically relative to an insulating trench between the pair of photodiodes. The shading mask may be fabricated as a metallization layer of a photodiode IC, spaced apart from the photodiodes by an insulation layer of the photodiode IC. Alternatively, an analogous device using an array of quadrant detectors (instead of detector pairs) is disclosed for detecting the angle of incidence "in two dimensions", that is, in two different planes. However, the device configurations disclosed in the '974 patent impose photodiode design and fabrication constraints that may be undesirable in various applications and/or IC fabrication processes. Improved angle of incidence detector configurations that overcome any or all of the foregoing disadvantages would be desirable.

SUMMARY OF THE INVENTION

The following summary is intended to present only a brief overview of certain aspects of the invention. The features of the invention that are described in this summary are exemplary only, and not limiting.

The present invention is directed to providing a detector configuration which is usable in a photosensitive device such as an IC or "chip" to determine the direction of illumination incident on the device. In one specific embodiment, a detector (or a plurality of detectors) formed according to the detector configuration may be utilized to adjust or compensate for the alignment of components of an optical sensing arrangement that is used in a metrology instrument or other optical system. In metrology systems that are utilized for determining precise physical measurements (e.g., with micron or sub-micron resolution), proper component alignment is often necessary to provide the best signal-to-noise (S/N) ratio and accuracy. For example, in one type of an optical encoder system, a light source is part of the measurement readhead electronics and the signal is provided by light reflected from a scale surface, in which case a proper orientation of the readhead light source relative to the scale surface is important in order for accurate measurements to be obtained, and to maintain the energy efficiency of the system.

In various embodiments, a detector configuration is provided for determining the direction of incident light relative to a surface. In one embodiment, a number of mask layers include a first layer and a second layer that include respective first-layer and second-layer holes that define an interlayer optical path through which radiation reaches a photodetector. The interlayer optical path may have a selected nominal maximum signal direction or angle. Thus, in operation, a detector according to the invention may sense when an illumination direction is near, or coincides with the nominal maximum signal direction. In a further embodiment, a third mask layer is included between the first and second mask layers and includes a third-layer hole arranged in an offset manner relative to first- and second-layer holes such that a cross-section through the resulting interlayer optical path along a plane approximately parallel to a plane of the first mask layer and a plane of the second mask layer has a smaller area than the input area of the second-layer hole and the output area of the first-layer hole. Such an embodiment may provide improved angular selectivity and/or sensitivity relative to a two-hole interlayer optical path. In some such embodiments, the cross-section through the resulting interlayer optical path has a smaller area than the area of the minimum hole size specified for the fabrication processes used to fabricate the detector.

In various embodiments, a detector according to this invention may be included in a photosensitive device, wherein the photosensitive device includes circuit elements that are not used for sensing the illumination direction, and the first mask layer and the second mask layer may be economically formed from material layers that are used to fabricate some of the circuit elements that are not used for sensing the illumination direction. In a further embodiment, the circuit elements that are not used for sensing the illumination direction may include a primary photodetector array that does not include the photodetectors that are used in the illumination direction-sensing detectors, and the photodetectors that are used in the illumination direction-sensing detectors may be economically formed during the same process steps that are used to form the photodetectors of the primary photodetector array.

In various embodiments, at least one material layer is formed between the first mask layer and the second mask layer, and the at least one material layer comprises at least one optically transmissive insulating layer. In a further embodiment, each material layer formed between the first and second mask layers is formed by a process step that is used to fabricate one of a circuit element, an insulator for a circuit element, and a protective layer for a circuit element, for a circuit element that is not used for sensing the illumination direction. In a further embodiment, the interlayer optical path is filled with optically transmissive insulating material, to mitigate potential unwanted diffraction effects.

In various embodiments, the detector is configured for sensing over a two-dimensional range, comprising an angle of incidence range and an azimuthal angle range, that includes the nominal peak signal direction.

In various embodiments, a plurality of similar detectors are provided for sensing the illumination direction. Each respective detector may have a respective nominal peak signal direction comprising an angle of incidence component and an azimuthal angle component. The photodetector of each detector may output a respective output signal depending on an amount of radiation it receives, and a combination of the respective outputs may be indicative of an angle of incidence component and an azimuthal angle component of the direction of illumination. In a further embodiment, a circuit may be included with the plurality of detectors to process a combination of respective outputs and provide an indication when the direction of illumination approximately coincides with a predetermined direction of illumination.

In various embodiments, a wavelength selective filter may be provided to filter the illumination reaching the photodetector(s) of the illumination direction-sensing detector(s).

In one embodiment, each of the first and second interlayer optical paths may transmit radiation to the same photodetector, wherein the first interlayer optical path has a first nominal peak signal direction and the second interlayer optical path has a second nominal peak signal direction, and for a first range of illumination directions that includes the first nominal peak signal direction the amount of radiation received by the photodetector is a maximum when the illumination direction approximately coincides with the first nominal peak signal direction, and the amount of radiation received by the first photodetector decreases as a function of increasing deviation between the illumination direction and the first nominal peak signal direction when the illumination direction is within the first range of illumination directions. Furthermore, for a second range of illumination directions that includes the second nominal peak signal direction the amount of radiation received by the first photodetector is a maximum when the illumination direction approximately coincides with the second nominal peak signal direction, and the amount of radiation received by the first photodetector decreases as a function of increasing deviation between the illumination direction and the second nominal peak signal direction when the illumination direction is within the second range of illumination directions.

In one embodiment, two similar detectors are provided for sensing an illumination direction, wherein the two detectors have different respective interlayer optical paths, different respective nominal peak signal directions and different respective photodetectors.

The various features outlined above may be used separately or in combination to provide a desired combination of benefits in various embodiments.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

In various exemplary embodiments of a detector configuration according to this invention, a plurality of metallization layers with holes form an angular filter which determines that only light input approximately along a respective nominal peak signal direction will reach a photodetector (e.g., a photodiode) located under the angular filtering arrangement. Thus, it should be appreciated that a nominal peak signal angle α referred to in the following description is dictated by a particular detector configuration, in practice. It should be also appreciated that in the general case, when light from a light source is not well aligned at the nominal peak signal angle α, the light is blocked by the angular filtering arrangement of the detector configuration, and the photodetector will therefore only provide a maximum signal when the light source is properly aligned at the angle α.

Figure 1:
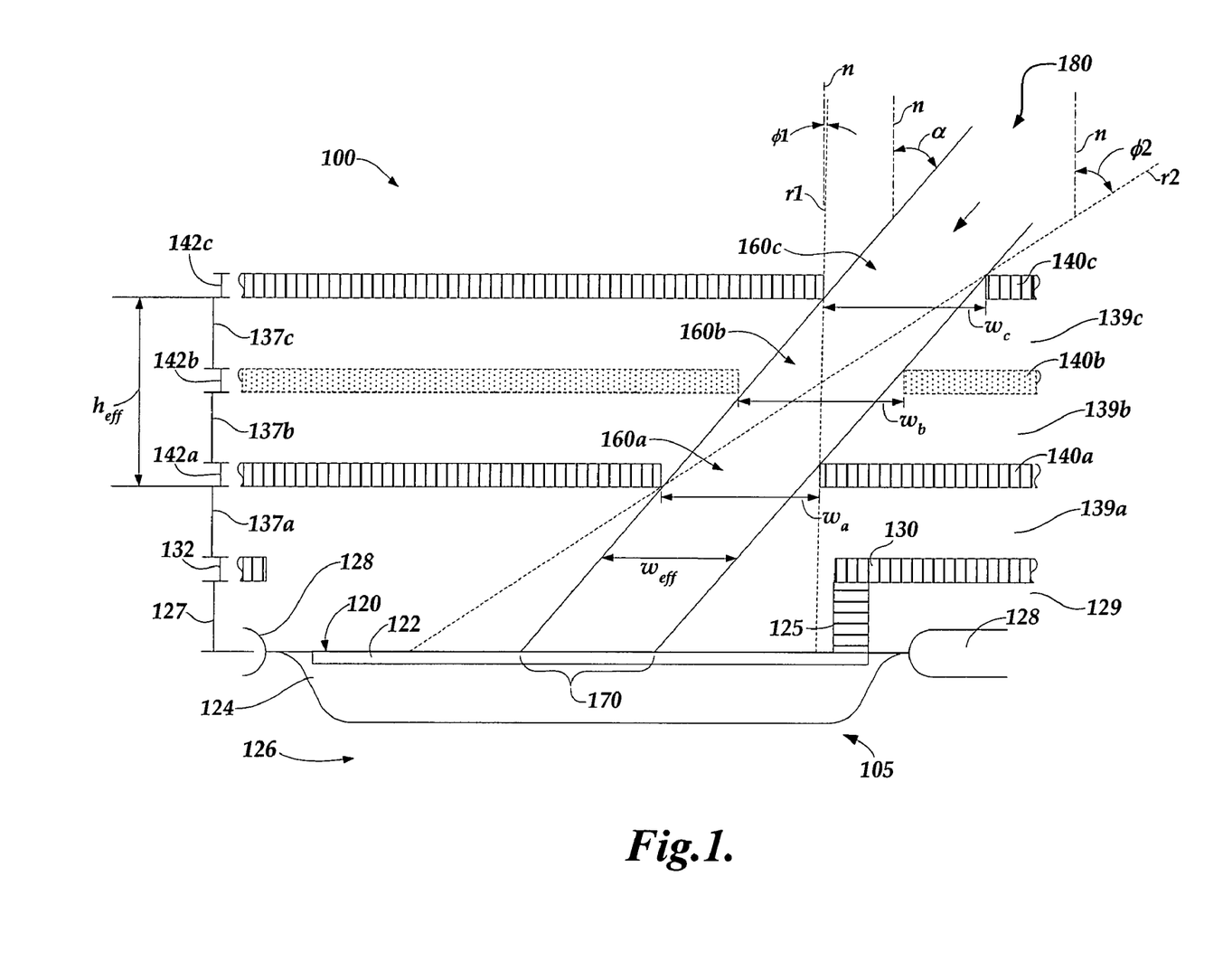
FIG. 1 is a side-view cross-section diagram of a first embodiment of a detector configuration according to this invention, wherein multiple metal layers provide holes forming an angled interlayer optical path that transmits incident light to a photodetector as a function of its angle of incidence.

FIG. 1 is a diagram of a first embodiment of a detector configuration 100 with an angled interlayer optical path 180 directed toward a photodetector 105 for sensing radiation at an angle of incidence corresponding to an angle α. The detector configuration 100 may be one of a plurality of similar configurations included a photodetector IC. The function of the detector configuration 100 may be an auxiliary function of the photodetector IC (e.g., an imaging array IC) as described in greater detail below. Each reference line n shown in FIG. 1 represents a vector normal to a nominal surface plane of the photodetector IC. While a photodiode type photodetector is illustrated, it will be appreciated that any light sensitive element could also be utilized, such as a photogate, photo-transister, etc. The term light, as used herein, is not restricted to visible radiation. As shown in FIG. 1, the photodetector 105 includes a surface 120, an N+ diffusion layer 122, a P well 124, a P substrate 126 and a field oxide layer 128. It will be appreciated that while a P well and a P substrate implementation is illustrated, any of the many other suitable photodetector fabrication processes may be utilized, such as are known in the art. The photodetector 105 is connected by an electrical connection post 125 to a first connection metal layer 130. Additional metal layers 140a, 140b, and 140c are configured to block incident light in the vicinity of the photodetector 105, except for the holes 160a, 160b and 160c, respectively, which are configured to form the angled interlayer optical path 180 at a nominal angle α, through which light may reach the photodetector 105.

Each of the holes 160a, 160b and 160c has a horizontal opening dimension $w_a$, $w_b$ and $w_c$, respectively. Each of the metal layers 130, 140a, 140b and 140c has a thickness 132, 142a, 142b and 142c, respectively. Below each metal layer 130, 140a, 140b and 140c may be respective supporting and insulating layers 129, 139a, 139b, 139c, that have nominal thicknesses 127, 137a, 137b, 137c, respectively, and are formed of a material having good or sufficient optical transmission characteristics (e.g., SiO$_2$). The insulating layer material may also fill each of the holes in the metal layers such that the layers merge, depending on the particular IC fabrication processes used. Filling the holes with the insulating material may be desirable because the holes may be small enough compared to the wavelength of the light that diffraction effects may be significant. Filling the holes with a material having an index of refraction higher than air helps to reduce unwanted diffraction effects.

The various interlayer optical path configurations and techniques disclosed herein may be used in an IC dedicated to detecting the angle of incident illumination. Alternatively, the interlayer optical path configurations and techniques disclosed herein may be implemented using layers and/or process steps that are different than those used to fabricate other structures on a photodetector IC (e.g., a camera array). However, in various embodiments, the thicknesses and materials of each metal layer and each insulating layer are advantageously the standard thicknesses and materials used to fabricate other structures on the photodetector IC. For example, each metal layer may be fabricated by the same process step(s) used to fabricate a connection layer used by other circuits on the photodetector IC. Likewise, each insulating layer may be fabricated by the same process step(s) used to fabricate an insulating layer that insulates or protects other circuit components on the photodetector IC. In addition, in various embodiments, the photodetector 105 may advantageously be fabricated by the same process step(s) used to fabricate other photodetector components on the photodetector IC. While metallization layers are described as defining the interlayer optical path 180, it will be appreciated that other relatively opaque material layers may also be used, such as second-poly, etc., depending on the process rules for forming the integrated circuit, the desired separation (thickness) between masking layers, etc.

In the embodiment shown in FIG. 1, the metallization layers 140a, 140b, and 140c are configured such that for the horizontal opening dimensions $w_a=w_b=w_c$ and each opening 160a-160c is horizontally offset from the adjacent opening by an amount that defines the desired angle α. In this case, the interlayer optical path 180 provides a maximum signal at the angle α. As shown in FIG. 1, the effective unobstructed width of the interlayer optical path 180 along a direction perpendicular to the surface normal n is designated $w_{eff}$, which, for approximately collimated illumination incident at the angle α, corresponds to a signal area 170 on the photodetector 105. More generally herein, the signal area 170 refers to or indicates that actual illumination area or signal area on the photodetector 105 for any given angle of illumination. Also shown are the limiting rays r1 and r2, which are rays at the most extreme angles φ1 and φ2, respectively, which may pass through the interlayer optical path 180. It can be seen that an effective height associated with the layer features which define the interlayer optical path 180 is designated as height $h_{eff}$. The ratio ($w_{eff}/h_{eff}$) of a detector configuration according to this invention may be adjusted such that the detector configuration provides an analog signal over a wider angular range or narrower angular range, according to the needs of a particular application. In particular, the ratio may be adjusted by selecting a desired opening dimension or dimensions to determine $w_{eff}$, and/or by the "offset" hole technique described below with reference to FIG. 2 and the detector configuration 200.

In the embodiment shown in FIG. 1, it may be seen that the opening 160b actually plays no role in defining the interlayer optical path 180 or the limiting rays r1 and r2. Therefore, in various embodiments, the "interior" metal layer 140b may be optional (that is, omitted, or etched away) in the vicinity of the detector configuration 100, if desired. In other embodiments, if it does not interfere with its primary function as a circuit connection to photodetector 105, the metal layer 130 may be configured to mask the photodetector 105 and provide a hole that may partially define the interlayer optical path 180. In such a case, the metal layer 140a may become an "interior" layer that may be optional in the vicinity of the detector configuration 100, if desired. In various embodiments, it may be advantageous if the photodetector 105 has dimensions such that the limiting rays r1 and r2 fall within its active area. For example, this may allow the photodetector 105 to have a simpler structure or isolation and still provide desirable signal characteristics, or may result in more predictable or usable signals from one or more incident angle detectors when the illumination is not well-collimated, or has an unknown angular intensity distribution, or the like. However, in other applications, the photodetector 105 may have smaller dimensions and various benefits of the invention will be retained.

In operation, assuming approximated collimated illumination, for angles of incidence other than the angle α, the signal area 170 on the photodetector 105 is diminished, resulting in a relatively diminished output signal. For example, for the angles of incidence φ1 and φ2 corresponding to the limiting rays R1 and R2, the signal area is reduced to approximately zero. Thus, in one example embodiment, if it is desired to orient the detector configuration 100 at the angle α with reference to an illumination direction, the detector configuration 100 (that is, the host photodetector IC), or the illumination source, may be rotated or otherwise moved until the signal output from the photodetector 105 is at a maximum, thus indicating a correct alignment.

In one embodiment, the distances 139a-139c between the metallization layers 140a-140c, respectively, as well as their thicknesses 142a-142c, may be on the order of approximately 1 micron, the opening dimensions $w_a$, $w_b$ and $w_c$ may be approximately 1.5 microns, and the photodetector 105 may have an active area dimension of approximately 6 microns.

In one embodiment, an incident angle detector according to the detector configuration 100, or alternative configurations described herein, may be fabricated by itself on a single chip. In another embodiment, the incident angle detector may be fabricated on a chip with other devices and circuits, as would be compatible with a linear array, quadrature detector arrays such as those described in U.S. Pat. No. 4,857,721 to Kojima, and U.S. Patent Application Publication No. 2005/0017158 to Kojima, which are hereby incorporated herein by reference, or a full imaging array (a camera). The chip may included circuits to process the incident angle detector data and report angles, angular deviations, wavelengths, surface tilt, tilt correction signals, or to be used in tilt calculations in order to compensate in the image processing or measurement results obtained from other devices on the chip. The fabrication of the detector may also be combined with MEMS devices. Wavelength selective filtering layers may also be added over any or all of the incident angle detectors on a chip, if desired.

Figure 2:
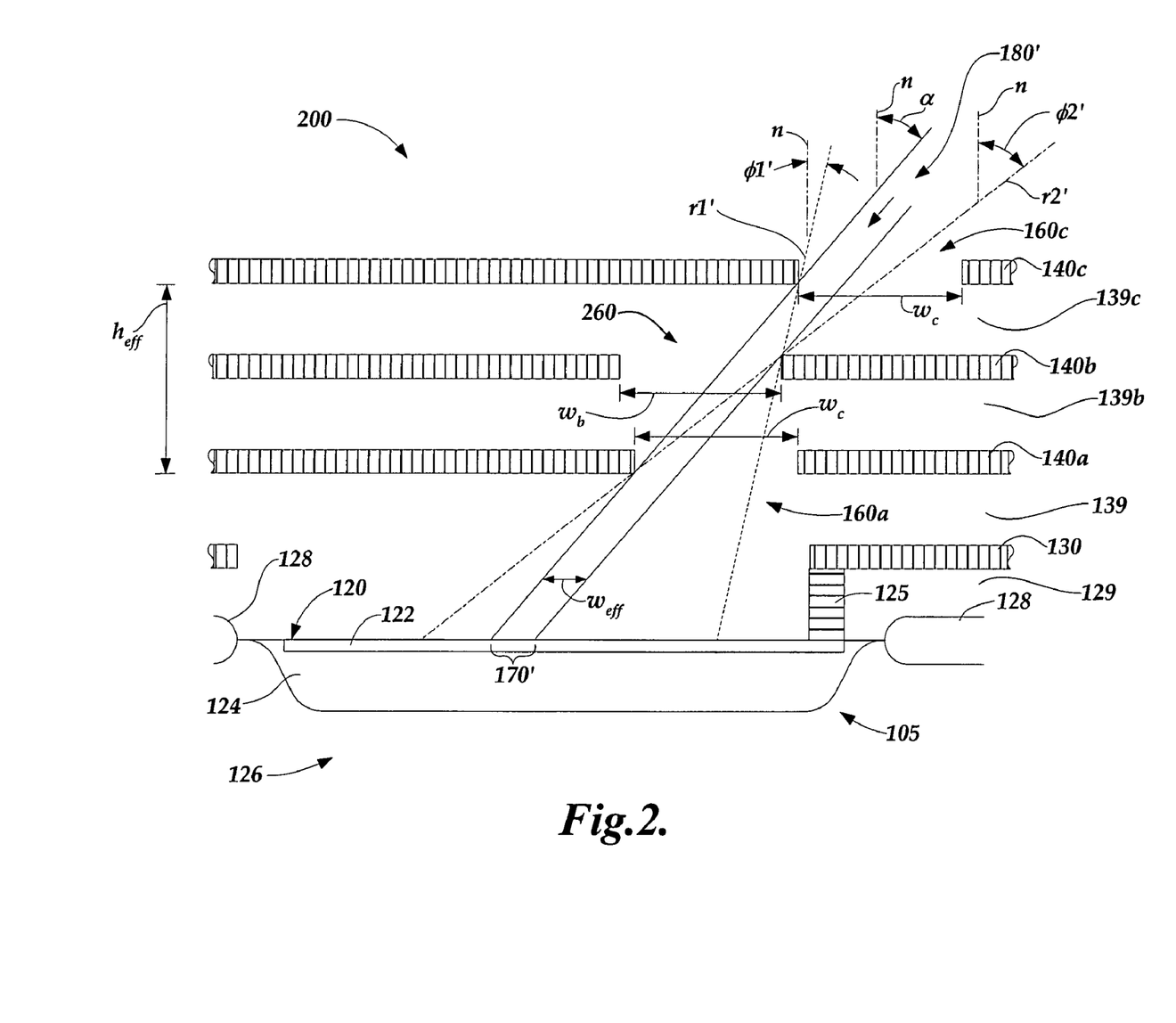
FIG. 2 is a side-view cross-section diagram of a second embodiment of a detector configuration according to this invention, wherein multiple metal layers provide holes that are configured to form an angled interlayer optical path that has a reduced width for transmitting incident light to a photodetector.

FIG. 2 is a diagram of a second embodiment of a detector configuration 200 with an angled interlayer optical path 180' directed toward a photodetector 105 for sensing radiation at an angle of incidence corresponding to an angle α. The illustrated components of the detector configuration 200 are similar to those of FIG. 1, except as otherwise described below. Each of the metal layers 130, 140a, 140b' and 140c and insulating layers 129, 139a, 139b, 139c, may be similarly fabricated and have similar thicknesses.

In contrast to the detector configuration 100, in the embodiment shown in FIG. 2, the "interior" metal layer 140b' provides an important function in defining the angled interlayer optical path 180', and is not optional in the vicinity of the photodetector 105. It should be appreciated that when the thicknesses and materials of each metal layer and each insulating layer are advantageously the standard thicknesses and materials used to fabricate other structures on the photodetector IC, that the number of layers and their thicknesses may generally be constrained. Thus, the height $h_{eff}$ may be effectively predetermined or "fixed". In addition, there is typically a minimum allowed or practical dimension for an opening through a metal layer, for example due to physical or economic fabrication constraints (e.g., process capability or process time limitations). In contrast to the detector configuration 100, by intentionally "offsetting" the interior layer hole 260 to occlude part of the interlayer optical path that would otherwise be established by the exterior layer holes 160a and 160c, the detector configuration 200 provides a dimension $w_{eff}$ for the interlayer optical path 180' that is less than any of the opening dimensions $w_a$, $w_b$ or $w_c$, even if the opening dimensions are the minimum allowed IC process dimensions. Described another way, the interior layer hole 260 is offset relative to the exterior layer holes 160a and 160c such the effective cross-sectional area of interlayer optical path 180' is nominally less than the area of the input hole 160c and the area of the output hole 160a of the interlayer optical path 180'.

As may be seen by comparison of FIGS. 1 and 2, the resulting limiting angles $\phi1'$ and $\phi2'$ for the "offset interior hole" detector configuration 200, which correspond to the limiting rays that may pass through the interlayer optical path 180', define a narrower angular range than the limiting angles $\phi1$ and $\phi2$ provided by the detector configuration 100. In such a case, the dimensions of the photodetector 105 could be reduced to correspond to the resulting limiting rays r1' and r2', if desired. It should be appreciated that offset holes in additional metal (or opaque) layers, if available, would allow further reduction of the angular range without a further reduction in the nominal width of the interlayer optical path 180' or the resulting maximum signal, if desired. It should be appreciated that although FIG. 2 shows a "one dimensional" view, in various embodiments one or more offset holes may be arranged to reduce the angular range of an interlayer optical path along two directions (e.g., orthogonal directions), simultaneously. It should be appreciated that, in general, during alignment or setup operations relatively long signal integration times may be used if necessary in order to accumulate a sufficient signal from the photodetector 105. Therefore, the interlayer optical path effective width, and the associated limiting angular range, may be made very narrow, such that the angle of incidence may be detected with very high angular resolution using a detector according to the detector configuration 200. It should be appreciated that if an interlayer optical path with the desired angular resolution outputs too little light to a detector, then a plurality of similar and parallel interlayer optical paths may be fabricated adjacent to each other, with all of the parallel optical paths outputting light to the same detector.

Figure 3:
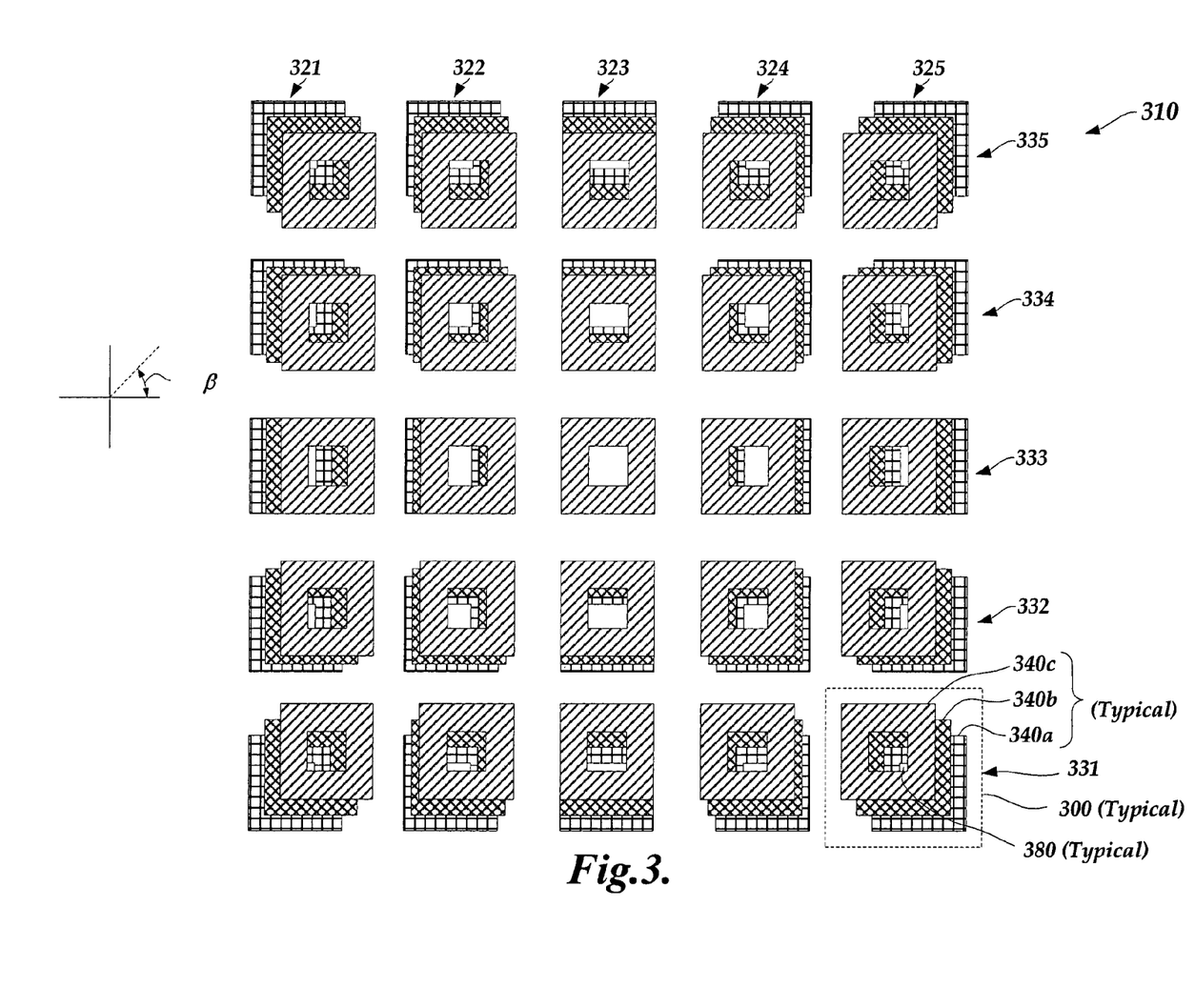
FIG. 3 is a plan-view diagram of an array of differently angled detectors having configurations of the type illustrated in FIG. 1.

FIG. 3 is a schematic plan view of one exemplary detector array 310 in which multiple detectors 300 are utilized for detecting radiation incident at multiple directions on the array 310. As shown in FIG. 3, the array 310 comprises detectors 300 in five rows 331-335, and five columns 321-325. Each of the respective detectors 300 may have a configuration similar to the detector configurations 100 or 200, as schematically represented by the three metal layers 340a, 340b and 340c, and the respective sets of holes for forming respective interlayer optical paths 380. The photodetectors associated with each detector are not shown, but will be understood based on FIGS. 1 and 2. The detectors 300 may be spaced apart at any convenient spacing that is consistent with their dimensions. It will be understood that the metal layers 340a, 340b and 340c may each be continuous between the detectors 300, if desired.

The general azimuthal angle $\beta$ shown in FIG. 3 may be defined about an axis that is approximately normal to the nominal plane of the detector array 310 and the associated photodetector plane, that is, normal to the plane of FIG. 3. As shown in FIG. 3, each respective detector 300 may be formed with their respective interlayer optical path 380 aligned along a respective nominal azimuthal angle $\beta$, as well as at a respective nominal angle of incidence $\alpha$ (as shown in FIGS. 1 and 2). Thus, an individual detector 300 may accurately determine an angle of incidence and an azimuthal angle of illumination with high resolution, while an array as a whole may cover a full 360 degrees of azimuthal angle and a very wide range of angles of incidence. It will be appreciated that the "offset" hole design principles described with reference to FIG. 2, may be used to decrease the angular sensing range and/or increase the angular sensing sensitivity with respect to the azimuthal angle, in a manner analogous to that used to increase the angle of incidence sensing sensitivity, by narrowing the interlayer optical path along the direction of the azimuthal angle variation.

More generally than shown in FIG. 3, the number and location of detectors in an array, as well as their nominal angles $\alpha$ and $\beta$, and their individual angular range limits, may be designed according to previously described principles in order to best meet the illumination analysis needs of a particular application. It will be appreciated that each of the detectors shown in FIG. 3 could be arranged along a single row or column to form a linear array, or in any other convenient layout on a chip, if desired. It will be appreciated that the signals from various combinations of detectors may undergo signal processing to enhance the detection of the illumination direction, for example, to normalize all the signals for common-mode illumination intensity variation, for mitigating the effects of a common mode angular distribution of illumination intensity (e.g., a Lambertian distribution), or the like. It will be appreciated that the various interlayer optical paths may be fabricated to have the same effective cross-sectional area, such that the detector having the maximum signal indicates the nominal direction of the illumination. Alternatively, the relative signal strengths of the various detectors may be calibrated and compensated to provide a similar result. It will be appreciated that while the holes shown in FIG. 3 are generally shown as being square, other potential shapes may also be utilized for the holes, such as circular, rectangular, grill, polygon, angled slot, etc. It will be appreciated that signals from various combinations of detectors may undergo signal processing to provide a feedback signal to a user (or an automatic control system), that is performing setup or alignment, to indicate which direction a tilt adjustment should be made in order to achieve a desired alignment. In various applications, this may facilitate the alignment of a photodetector chip, or an assembly including the chip, or a source that is providing the illumination, or a reflective surface that is providing reflected illumination. For example, such applications are facilitated when the detectors disclosed herein are fabricated and/or assembled in conjunction with devices disclosed in U.S. patent application Ser. No. 11/396,368 to Sesko, U.S. patent application Ser. No. 10/804,636 to Shimomura et al., U.S. Pat. No. 5,995,229 to Omi, and U.S. Pat. No. 6,642,506 to Nahum and Masreliez, each of which is hereby incorporated herein by reference.

Figure 4:
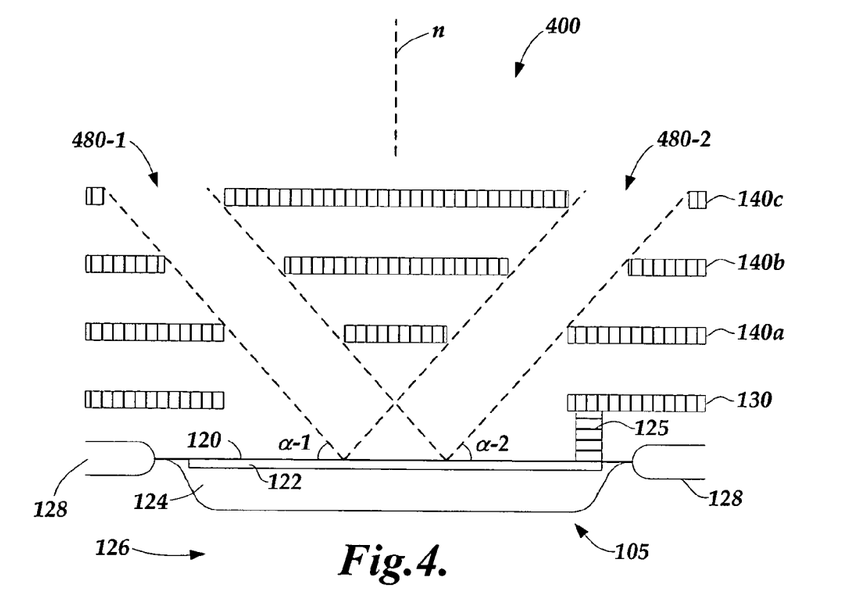
FIG. 4 is a diagram of a first dual angle detector configuration wherein multiple metal layers with holes form two angled interlayer optical paths that transmit incident light to a single photodetector for two different angles of incidence.

FIG. 4 is a schematic diagram of a detector configuration 400 which includes two interlayer optical paths 480-1 and 480-2 which are directed toward a shared photodetector 105. The components and configuration of each of the interlayer optical paths 480-1 and 480-2 may be similar to those previously described for the detector configurations 100 or 200. The nominal angles α-1 and α-2 may be designed to be of equal magnitude, or different magnitudes, if desired.

In operation, the detector configuration 400 is able to detect the direction of radiation incident on the detector in a limited angular range around either or both of the nominal angles α-1 and α-2. The detector configuration 400 may be used whenever additional information (such as a signal from an additional detector, or a host system set up or timing constraint, etc.) is available to determine which of the interlayer optical paths 480-1 or 480-2 is producing the signal on the photodetector 105. In one application, the detector configuration 400 may be mounted to rotate about an axis very roughly aligned with the normal vector n, and receive illumination within its angular sensing range. Assuming the interlayer optical paths 480-1 or 480-2 have substantially identical cross-sections, when each path produces an identical signal during rotation, then the normal vector n is aligned precisely parallel to the rotation axis.

Figure 5:
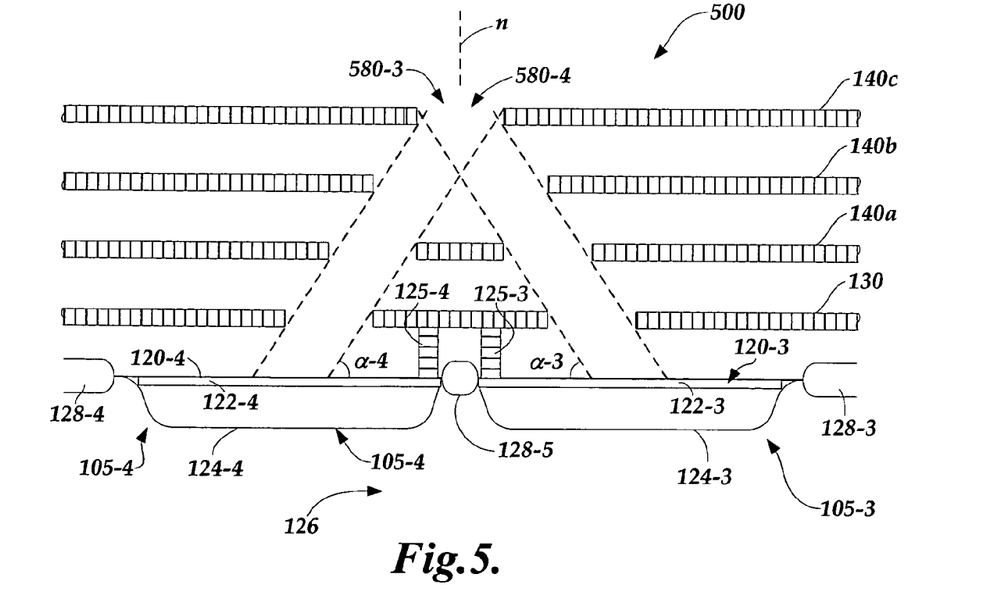
FIG. 5 is a diagram of a second dual angle detector configuration wherein multiple metal layers with holes form two angled interlayer optical paths that transmit incident light to two respective photodetectors for two different angles of incidence.

FIG. 5 is a schematic diagram of a detector configuration 500 which includes two interlayer optical paths 580-3 and 580-4 which are directed toward two photodetectors 105-3 and 105-4, respectively. The components and configuration of each of the interlayer optical paths 580-3 and 580-4, and the photodetectors 105-3 and 105-4, may be similar to those previously described for the detector configurations 100 or 200. In operation, the detector configuration 500 is able to use a single input hole to illuminate two photodetectors along two different interlayer optical paths.

The signals from the photodetectors 105-3 and 105-4 may be processed as differential signals. When the nominal angles α-3 and α-4 have the same magnitude and the interlayer optical paths 580-3 and 580-4 have substantially identical cross-sections, and the signals from the photodetectors 105-3 and 105-4 are balanced, then the illumination direction is parallel to the normal vector, assuming the illumination direction is within the angular sensing range of each of the interlayer optical paths 580-3 and 580-4. Conversely, the amount of imbalance between the signals from the photodetectors 105-3 and 105-4 may be indicative of the angle of incidence over the combined angular sensing ranges of the interlayer optical paths 580-3 and 580-4. If the nominal angles α-3 and α-4 are designed to be different magnitudes, then the signals will balance at a corresponding angle of incidence that is not along the normal vector.

While the preferred embodiment of the invention has been illustrated and described, numerous variations in the illustrated and described arrangements of features and sequences of operations will be apparent to one skilled in the art based on this disclosure. Thus, it will be appreciated that various changes can be made therein without departing from the spirit and scope of the invention.

The embodiments of the invention in which an exclusive property or privilege is claimed are defined as follows:

1. A photosensitive device including at least a first illumination direction sensing detector configuration that is used to provide an illumination direction indicating signal that varies as a function of an illumination direction relative to the device of incident radiation falling on the device, the illumination direction sensing detector configuration comprising:

a first photodetector on a photodetector substrate, the first photodetector being operable to output a first signal that varies depending on an amount of radiation it receives;

a first mask layer fixed proximate to a surface of the first photodetector, the first mask layer including a first-layer hole arranged to receive radiation along an interlayer optical path and transmit radiation to the first photodetector; and a second mask layer fixed proximate to a surface of the first mask layer, the second mask layer including a second-layer hole arranged to receive the incident radiation along its illumination direction relative to the device and transmit the incident radiation to the first-layer hole along the interlayer optical path;

wherein:

the second-layer hole that transmits the incident radiation to the first-layer hole along the interlayer optical path defines an input of the interlayer optical path, the second-layer hole having an input area;

the first-layer hole that receives radiation along the interlayer optical path and transmits the radiation to the first photodetector defines an output of the interlayer optical path, the first-layer hole having an output area;

the first photodctector is configured to have dimensions arranged relative to the interlayer optical path such that any incident radiation light rays that are at the most extreme angles that may pass through both the first layer hole and the second layer hole and along the interlayer optical path fall within the active area of the first photodetector; and the interlayer optical path is configured to define a nominal peak signal direction and is also configured such that, for a first range of illumination directions that includes the nominal peak signal direction, the amount of radiation received by the first photodetector through the interlayer optical path is a maximum when the illumination direction approximately coincides with the nominal peak signal direction and the amount of radiation received by the first photodetector through the interlayer optical path decreases as a function of increasing deviation between the illumination direction and the nominal peak signal direction throughout the first range, such that the first signal output by the first photodetector varies throughout the first range as a function of the illumination direction of the incident radiation falling on the device.

2. The device of claim 1, wherein a third mask layer fixed between the first and second mask layers includes a third-layer hole arranged in an offset manner relative to the first- and second-layer holes such that a cross-section through the resulting interlayer optical path along a plane approximately parallel to a plane of the first mask layer and a plane of the second mask layer has a smaller area than the input area of the second-layer hole and the output area of the first-layer hole and is utilized for providing a higher angular resolution for the sensing of the illumination direction relative to an angular resolution that would be available from utilizing the first and second-layer holes alone.

3. The device of claim 2, wherein the cross-section through the resulting interlayer optical path has a smaller area than the area of the minimum hole size specified for the fabrication processes used to fabricate the device.

4. The device of claim 1, wherein the photosensitive device includes circuit elements that are not used for sensing the illumination direction and at least some of which are fabricated in at least one of the first mask layer and the second mask layer.

5. The device of claim 4, wherein the circuit elements that are not used for sensing the illumination direction include a photodetector array that does not include the first photodetector, and the first photodetector is formed during the same process steps that are used to form the photodetectors of the photodetector array that does not include the first photodetector and without the use of additional process steps.

6. The device of claim 4, wherein at least one material layer is formed between the first mask layer and the second mask layer, the at least one material layer comprising at least one optically transmissive insulating layer, and each material layer formed between the first and second mask layers is used to fabricate one of a circuit element, an insulator for a circuit element, and a protective layer for a circuit element, for a circuit element that is not used for sensing the illumination direction.

7. The device of claim 1, wherein:
the first range of illumination directions that includes the nominal peak signal direction is a two-dimensional range comprising an angle of incidence range and an azimuthal angle range;
the photosensitive device includes a plurality of respective illumination direction sensing detector configurations similar to the first illumination direction sensing detector configuration for sensing an illumination direction of the incident radiation, each respective illumination direction sensing configuration having a respective first photodetector and a respective interlayer optical path that is configured to define a respective nominal peak signal direction and that is also configured such that, for a respective first range of illumination directions that includes the respective nominal peak signal direction, amount of radiation received by the respective first photodetector through the respective interlayer optical path is a maximum when the illumination direction approximately coincides with the respective nominal peak signal direction and the amount of radiation received b the respective first photodetector through the respective interlayer optical path decreases as a function of increasing deviation between the illumination direction and the respective nominal peak signal direction throughout the respective first range, such that a respective first signal output by the respective first photodetector varies throughout the respective first range as a function of the illumination direction of the incident radiation falling on the device; and
a combination of the respective first signal outputs is indicative of an angle of incidence component and an azimuthal angle component of the direction of illumination.

8. The device of claim 7, wherein the device includes a circuit which processes a combination of the respective first signal outputs and indicates when the direction of illumination approximately coincides with a predetermined direction of illumination.

9. The device of claim 1, further comprising a wavelength selective filter that filters the radiation reaching the first photodetector.

10. The device of claim1, wherein:
the second mask layer includes two respective second-layer holes, the two respective second-layer holes providing inputs for the first interlayer optical path and a second interlayer optical path, each interlayer optical path formed in combination with the first-layer hole;
the first photodetector is configured to have dimensions arranged relative to the second interlayer optical path such that any incident radiation light rays that are at the most extreme angles that may pass through both the first layer hole and the respective second layer hole of the second interlayer optical path fall within the active area of the first photodetector;
each of the first and second interlayer optical paths transmit radiation to the first photodetector;
the first interlayer optical path defines a first nominal peak signal direction comprising a first angle of incidence component and a first azimuthal angle component and the second interlayer optical path defines a second nominal peak signal direction comprising a second angle of incidence component and a second azimuthal angle component;
the first interlayer optical path is configured such that, for a first range of illumination directions that includes the first nominal peak signal direction, the amount of radiation received by the first photodetector is a maximum when the illumination direction approximately coincides with the first nominal peak signal direction and the amount of radiation received by the first photodetector through the first interlayer optical path decreases as a function of increasing deviation between the illumination direction, and the first nominal peak signal direction throughout the first range when the illumination direction is within the first range of illumination directions; and
the second interlayer optical path is configured such that, for a second range of illumination directions that includes the second nominal peak signal direction, the amount of radiation received by the first photodetector is a maximum when time illumination direction approximately coincides with the second nominal peak signal direction, and the amount of radiation received by the first photodetector through the second interlayer optical path decreases as a function of increasing deviation between the illumination direction and the second nominal peak signal direction throughout the second range when the illumination direction is within the second range of illumination directions, such that the first signal output by the first photodetector varies throughout the first and second ranges as a function of the illumination direction of the incident radiation falling on the device.

11. The device of claim 1, wherein:
the photosensitive device includes a second illumination direction sensing detector configuration similar to the first illumination direction sensing detector configuration for sensing an illumination direction of the incident radiation;
each of the two illumination direction sensing detector configurations have different respective interlayer optical paths, different respective nominal peak signal directions and different respective photodetectors; and
the two illumination direction sensing detector configurations use the same second-layer hole as the input to their respective interlayer optical paths.

12. The device of claim 1, wherein:
the first mask layer includes a plurality of respective first-layer holes that transmit radiation to the first photodetector;
the second mask layer includes a plurality of respective second-layer holes, each respective second layer hole transmitting the incident radiation to a respective one of the first-layer holes along a respective interlayer optical path;

each respective interlayer optical path has a nominal peak signal direction and at least two respective interlayer optical paths are configured to have parallel nominal peak signal directions; and the first photodetector is arranged relative to the at least two respective interlayer optical paths such that for a first range of illumination directions that includes the parallel nominal peak signal directions the amount of radiation received by the first photodetector is a maximum when the illumination direction approximately coincides with the parallel nominal peak signal directions, and the amount of radiation received by the first photodetector decreases as a function of increasing deviation between the illumination direction and the parallel nominal peak signal directions when the illumination direction is within the first range of illumination directions.

13. A method of fabricating at least a first instance of an illumination direction sensing detector configuration on a photosensitive device, the method comprising:

fabricating the illumination direction sensing detector configuration such that it provides a signal that varies as a function of an illumination direction relative to the device of incident radiation falling on the device, the fabricating of the illumination direction sensing detector configuration comprising:

fabricating a first photodetector on a photodetector substrate, the first photodetector being operable to output a first signal that varies depending on an amount of radiation it receives;

fabricating a first mask layer fixed proximate to a surface of the first photodetector, the first mask layer being processed to include a first-layer hole that is arranged to receive radiation along an interlayer optical path and transmit radiation to the first photodetector; and fabricating a second mask layer fixed proximate to a surface of the first mask layer, the second mask layer being processed to include a second-layer hole that is arranged to receive the incident radiation along its illumination direction relative to the device and transmit the incident radiation to the first-layer hole along the interlayer optical path;

wherein:

the second-layer hole that transmits the incident radiation to the first-layer hole along the interlayer optical path defines an input of the interlayer optical path, the second-layer hole having an input area;

the first-layer hole that receives radiation along the interlayer optical path and transmits the radiation to the first photodetector defines an output of the interlayer optical path, the first layer hole having an output area;

fabricating the first photodetector comprises configuring the first photodetector to have dimensions arranged relative to the interlayer optical path such that any incident radiation light rays that are at the most extreme angles that may pass through both the first layer hole and the second layer hole and along the interlayer optical path fall within the active area of the first photodetector; and fabricating the illumination direction sensing detector further comprises configuring the interlayer optical path to define a nominal peak signal direction, and configuring the interlayer optical path such that, for a first range of illumination directions that includes the nominal peak signal direction, the amount of radiation received by the first photodetector through the interlayer optical path is a maximum when the illumination direction approximately coincides with the nominal peak signal direction and the amount of radiation received by the first photodetector through the interlayer optical path decreases as a function of increasing deviation between the illumination direction and the nominal peak signal direction throughout the first range, such that the first signal output by the first photodetector varies throughout the first range as a function of the illumination direction of the incident radiation falling on the device.

14. The method of claim 13, further comprising fabricating a third mask layer fixed between the first and second mask layers, the third mask layer being processed to include a third-layer hole arranged in an offset manner relative to the first- and second-layer holes such that a cross-section through the resulting interlayer optical path along a plane approximately parallel to a plane of the first mask layer and a plane of the second mask layer has a smaller area than the input area of the second-layer hole and the output area of the first-layer hole and utilizing the resulting interlayer optical path for providing a higher angular resolution for the sensing of the illumination direction relative to an angular resolution that would be available from utilizing the first and second-layer holes alone.

15. The method of claim 14, wherein the cross-section through the resulting interlayer optical path has a smaller area than the area of the minimum hole size specified for the fabrication processes used to fabricate the device.

16. The method of claim 13, further comprising fabricating additional circuit elements that are riot used for sensing the illumination direction, the additional circuit elements being fabricated in at least one of the first mask layer and the second mask layer.

17. The method of claim 16, wherein the circuit elements that are not used for sensing the illumination (direction include a photodetector array that does not include the first photodetector, and the first photodetector is formed during the same process steps that are used to form the photodetectors of the photodetector array that does not include the first photodetector and without the use of additional process steps.

18. The method of claim 16, further comprising forming the first mask layer and the second mask layer from metal layers that are used to fabricate circuit connections on the photosensitive device.

19. The method of claim 16, further comprising forming at least one material layer between the first mask layer and the second mask layer, the at least one material layer comprising at least one optically transmissmive insulating layer, and each material layer formed between the first and second mask layers is used to fabricate one of a circuit element, an insulator for a circuit element, and a protective layer for a circuit element, for a circuit element that is not used for sensing the illumination direction.

20. The device of claim 5, wherein the photodetector array that does not include the first photodetector comprises a quadrature detector array usable in an optical encoder system for determining physical measurements.

21. A method for operating the device of claim 20, comprising:

providing an optical encoder system comprising the device of claim 20, a light source and a scale;

operably arranging the optical encoder system such that light from the light source is reflected from a surface of the scale to the device of claim 20, wherein the light reflected from the surface of the scale to the device of claim 20 provides an incident radiation having an illumination direction relative to the device of claim 20;

sensing the illumination direction using the device of claim 20; and adjusting the alignment of components of the operably arranged optical encoder system based at least partially on an output signal of the device of claim 20 and providing a desired orientation of the light source relative to the surface of the scale.

22. The device of claim 4, wherein the first mask layer and the second mask layer are formed from metal layers that are used to fabricate circuit connections on the photosensitive device.

23. The device of claim 6, wherein the interlayer optical path is filled with optically transmissive insulating material.

* * * * *

UNITED STATES PATENT AND TRADEMARK OFFICE
CERTIFICATE OF CORRECTION

PATENT NO. : 7,466,002 B2  Page 1 of 1
APPLICATION NO. : 11/471054
DATED : December 16, 2008
INVENTOR(S) : J. L. Shaffer It is certified that error appears in the above-identified patent and that said Letters Patent is hereby corrected as shown below:

| COLUMN | LINE | ERROR |
|---|---|---|
| 11 (Claim 7, | 28 line 12) | After "photodetector" insert --,-- |
| 11 (Claim 7, | 37 line 21) | "received b" should read --received by-- |
| 14 (Claim 16, | 29 line 2) | "riot" should read --not-- |
| 14 (Claim 17, | 34 line 2) | before "direction" delete "(" |
| 14 (Claim 1, | 47 line 4) | "transmissmive" should read --transmissive-- |

Signed and Sealed this

Seventeenth Day of November, 2009

David J. Kappos
*Director of the United States Patent and Trademark Office*